(12) United States Patent
Ko et al.

(10) Patent No.: US 10,627,955 B2
(45) Date of Patent: Apr. 21, 2020

(54) TOUCH DISPLAY APPARATUS INTEGRATED FINGERPRINT SENSOR

(71) Applicant: Samsung Display Co., Ltd., Yongin-si (KR)

(72) Inventors: Gwang-Bum Ko, Suwon-si (KR); Yeri Jeong, Suwon-si (KR); Jeongyun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 171 days.

(21) Appl. No.: 15/838,279

(22) Filed: Dec. 11, 2017

(65) Prior Publication Data

US 2019/0018540 A1    Jan. 17, 2019

(30) Foreign Application Priority Data

Jul. 11, 2017 (KR) .......................... 10-2017-0087956

(51) Int. Cl.
*G06F 3/041* (2006.01)
*G06F 3/044* (2006.01)
(Continued)

(52) U.S. Cl.
CPC ............ *G06F 3/0418* (2013.01); *G06F 3/044* (2013.01); *G06F 3/0412* (2013.01);
(Continued)

(58) Field of Classification Search
CPC ...... G06F 3/0418; G06F 3/044; G06F 3/0412; H01L 27/3234; H01L 27/323;
(Continued)

(56) References Cited

U.S. PATENT DOCUMENTS 8,564,314 B2 *  10/2013  Shaikh ................. G06K 9/0002
                                                     324/658
8,970,515 B2    3/2015  Moran et al.
(Continued)

FOREIGN PATENT DOCUMENTS

CN       104021371       9/2014
CN       105159506       12/2015
(Continued)

OTHER PUBLICATIONS

Extended European Search Report dated Nov. 7, 2018, issued in the European Patent Office for European Patent Application No. 18168603.1.

*Primary Examiner* — Ariel A Balaoing
(74) *Attorney, Agent, or Firm* — H.C. Park & Associates, PLC

(57) ABSTRACT

A touch display apparatus integrated fingerprint sensor includes a plurality of pixels arranged in a display area, a plurality of touch sensor electrodes arranged in a touch sensor area overlapping with the display area, a plurality of fingerprint sensor electrodes arranged in a fingerprint sensor area which is spaced apart from the touch sensor area and overlaps with the display area, and a plurality of fingerprint lines overlapping with a plurality of touch sensor electrodes which is located in an area adjacent to the fingerprint sensor area and associated with driving of the plurality of fingerprint sensor electrodes. The plurality of fingerprint lines may include a fingerprint guard line surrounding the fingerprint sensor area, and a fingerprint electrostatic line surrounding the fingerprint sensor area. The fingerprint guard line and fingerprint electrostatic line increase sensor reliability by shielding the plurality of fingerprint sensor electrodes from external signals and electrostatic discharge.

18 Claims, 11 Drawing Sheets

(51) Int. Cl.
 *G06K 9/00* (2006.01)
 *H01L 27/32* (2006.01)
 *H01L 27/146* (2006.01)

(52) U.S. Cl.
 CPC .......... *G06K 9/0002* (2013.01); *H01L 27/323* (2013.01); *H01L 27/3234* (2013.01); *H01L 27/3244* (2013.01); *G06F 2203/0338* (2013.01); *G06F 2203/04107* (2013.01); *G06F 2203/04111* (2013.01); *H01L 27/14636* (2013.01); *H01L 27/14678* (2013.01)

(58) Field of Classification Search
 CPC .......... H01L 27/14678; H01L 27/3244; H01L 27/14636; G06K 9/0002
 See application file for complete search history.

(56) References Cited

U.S. PATENT DOCUMENTS

| | | | |
|---|---|---|---|
| 9,465,491 | B2 | 10/2016 | Shaikh et al. |
| 2006/0227114 | A1* | 10/2006 | Geaghan ............... G06F 3/0418 345/173 |
| 2012/0090757 | A1 | 4/2012 | Buchan et al. |
| 2012/0105081 | A1* | 5/2012 | Shaikh ................. G06K 9/0002 324/686 |
| 2013/0181949 | A1* | 7/2013 | Setlak ..................... G06F 3/042 345/175 |
| 2013/0335365 | A1* | 12/2013 | Kim ........................ G06F 3/044 345/174 |
| 2013/0341651 | A1 | 12/2013 | Kim et al. |
| 2016/0253540 | A1 | 9/2016 | Han et al. |
| 2016/0350570 | A1* | 12/2016 | Han ..................... G06K 9/0002 |
| 2016/0364593 | A1* | 12/2016 | Lee ....................... G06F 3/0416 |
| 2017/0024602 | A1 | 1/2017 | Han et al. |

FOREIGN PATENT DOCUMENTS

| | | |
|---|---|---|
| DE | 10-2011-085578 | 5/2012 |
| KR | 10-2011-0127236 | 11/2011 |
| KR | 10-2016-0141169 | 12/2016 |
| KR | 10-2017-0010935 | 2/2017 |
| TW | 201627918 | 8/2016 |

\* cited by examiner

TOUCH DISPLAY APPARATUS INTEGRATED FINGERPRINT SENSOR

CROSS-REFERENCE TO RELATED APPLICATION

This application claims priority from and the benefit of Korean Patent Application No. 10-2017-0087956, filed on Jul. 11, 2017, which is hereby incorporated by reference for all purposes as if fully set forth herein.

BACKGROUND

Field

Exemplary embodiments relate to a scan driver and a display apparatus including the scan driver. More particularly, exemplary embodiments relate to a scan driver for improving a reliability of a transistor and a display apparatus including the scan driver.

Discussion of the Background

With the development of computer technology, computer based system that can be allied to various utilities such as notebook computers, tablet personal computers (PCs), smart phones, personal digital assistants (PDAs), automated teller machines (ATMs), and information system, have been developed. In general, computer based system store various data including private information related to private affairs. Thus, strong security mechanisms are typically desired to protect such information.

To this end, fingerprint sensors have been developed to strengthen security by performing registration or certification of system using fingerprints of human beings. The fingerprint sensor is a sensor capable of sensing fingerprints of human being. A fingerprint sensor may include a capacitive fingerprint sensor. The capacitive fingerprint sensor is configured to detect a fingerprint using a potential difference between a ridge and a valley of the contacting fingerprint.

The above information disclosed in this Background section is only for enhancement of understanding of the background of the inventive concepts, and, therefore, it may contain information that does not form the prior art that is already known in this country to a person of ordinary skill in the art.

SUMMARY

Exemplary embodiments provide a touch display apparatus with an integrated fingerprint sensor for improving a sensitivity of fingerprint sensing.

Additional aspects will be set forth in the detailed description which follows, and, in part, will be apparent from the disclosure, or may be learned by practice of the inventive concepts.

According to exemplary embodiments, there is provided a touch display apparatus is integrated fingerprint sensor. The touch display apparatus includes a plurality of pixels arranged in a display area, a plurality of touch sensor electrodes arranged in a touch sensor area overlapping with the display area, a plurality of fingerprint sensor electrodes arranged in a fingerprint sensor area which is spaced apart from the touch sensor area and overlaps with the display area, and a plurality of fingerprint lines overlapping with a plurality of touch sensor electrodes which is located in an area adjacent to the fingerprint sensor area and associated with driving of the plurality of fingerprint sensor electrodes.

In an exemplary embodiment, the plurality of touch sensor electrodes may include a first touch sensor electrode extending in a first direction and comprising a plurality of first connection patterns and a plurality of first touch electrode patterns, the plurality of first connection patterns formed from a first conductive layer, the plurality of first touch electrode patterns formed from a second conductive layer different from the first conductive layer and connected to each other by the plurality of first connection patterns, and a second touch sensor electrode extending in a second direction crossing the first direction and comprising a plurality of second connection patterns and a plurality of second touch electrode patterns, the plurality of second connection patterns formed from the second conductive layer, the plurality of second touch electrode patterns formed from the second conductive layer and connected to each other by the plurality of second connection patterns.

In an exemplary embodiment, the plurality of fingerprint sensor electrodes may include a first fingerprint sensor electrode extending in the first direction and formed from the first conductive layer and a second fingerprint sensor electrode extending in the second direction crossing the first direction and formed from the second conductive layer.

In an exemplary embodiment, the plurality of fingerprint lines may be formed is from the first conductive layer and the touch sensor electrodes is formed from the second conductive layer.

In an exemplary embodiment, the plurality of fingerprint lines may include a plurality of fingerprint sensor lines which is respectively connected to the plurality of fingerprint sensor electrodes.

In an exemplary embodiment, an odd numbered fingerprint sensor line may be connected to an odd numbered fingerprint sensor electrode and an even numbered fingerprint sensor line is connected to an even numbered fingerprint sensor electrode, wherein the odd numbered fingerprint sensor line may be disposed at a first side portion of the fingerprint sensor area and the even numbered fingerprint sensor line may be disposed at a second side portion of the fingerprint sensor area, where the second side portion of the fingerprint sensor area is opposite to the first side portion of the fingerprint sensor area.

In an exemplary embodiment, the fingerprint sensor lines may be disposed at a first side portion of the fingerprint sensor area or a second side portion of the fingerprint sensor area, where the second side portion of the fingerprint sensor area is opposite to the first side portion of the fingerprint sensor area.

In an exemplary embodiment, the plurality of fingerprint lines may include a fingerprint guard line which surrounds the fingerprint sensor area and prevents external signals from interfering with the plurality of fingerprint sensor electrodes.

In an exemplary embodiment, the plurality of fingerprint lines may include a fingerprint electrostatic line which surrounds the fingerprint sensor area and shields the plurality of fingerprint sensor electrodes from electrostatic discharge.

In an exemplary embodiment, the touch display apparatus may further include a sensor driver circuit configured to drive the touch sensor electrodes and the fingerprint sensor electrodes, wherein the sensor driver circuit may be configured to provide the fingerprint sensor lines with a ground signal during a touch sensor period and provide the touch sensor electrodes with the ground signal during a fingerprint sensor period.

In an exemplary embodiment, the touch display apparatus may further include a plurality of fan-out lines arranged in a peripheral area between the fingerprint sensor area and the sensor driver circuit and connected to the fingerprint sensor lines, a shielding electrode disposed on the plurality of fan-out lines and receiving a ground signal, a touch guard line surrounding the touch sensor area and shielding external signals from interfering with the touch sensor electrodes and a touch electrostatic line surrounding the touch sensor area and shielding the touch sensor electrodes from electrostatic discharge.

In an exemplary embodiment, the shielding electrode may be connected to at least one of the touch guard line and the touch electrostatic line.

In an exemplary embodiment, the plurality of fingerprint sensor electrodes may include a first fingerprint sensor electrode extending in a third direction crossing the first and second directions and formed from the first conductive layer and a second fingerprint sensor electrode extending in a fourth direction crossing the third direction and formed from the second conductive layer.

In an exemplary embodiment, the plurality of fingerprint lines may include a fingerprint guard line which surrounds the fingerprint sensor area and prevents the plurality of fingerprint sensor electrodes from external signals.

In an exemplary embodiment, the plurality of fingerprint lines may include a fingerprint electrostatic line which surrounds the fingerprint sensor area and shields the plurality of fingerprint sensor electrodes from electrostatic discharge.

In an exemplary embodiment, the touch display apparatus may further include a pad part disposed in a peripheral area surrounding the display area, a plurality of fan-out lines arranged in the peripheral area between the pad part and the display area, a shielding electrode disposed on the fan-out lines and receiving a ground signal, a touch guard line surrounding the touch sensor area and preventing the touch sensor electrodes from external signals, and a touch electrostatic line surrounding the touch sensor area and shielding the touch sensor electrodes from electrostatic discharge.

In an exemplary embodiment, the shielding electrode may be connected to at least one of the touch guard line and the touch electrostatic line.

In an exemplary embodiment, the touch display apparatus may further include a base substrate, a pixel circuit disposed on the based substrate and comprising a plurality of transistors, a display element layer disposed on the pixel circuit and comprising a plurality of display elements which display a grayscale using a light, and an encapsulation layer covering over the display element layer and disposed on the display element layer, wherein the first conductive layer may be disposed on the encapsulation layer and the second conductive layer is disposed on the first conductive layer.

In an exemplary embodiment, the display element may include an organic light emitting diode.

In an exemplary embodiment, the first conductive layer may have conductivity different from that of a finger, and the second conductive layer has conductivity being substantially the same as that of the finger.

According to the inventive concepts, the fingerprint sensor lines are disposed under the touch sensor electrodes and thus, in the fingerprint sensor mode, the touch sensor electrodes shield the first fingerprint sensor lines from interference by the contacting finger and thus errors of detecting the fingerprint may be avoided. In addition, the ground signal is applied to the touch sensor electrodes to increase a shielding function. The shielding electrode is disposed on the fan-out line of the fingerprint sensor line and thus, in the fingerprint sensor mode, the touch sensor electrodes shield the first fingerprint sensor lines from interference by the contacting finger and thus errors of detecting the fingerprint may be avoided. In addition, the shielding electrode is connected to the guard line or the electrostatic line which receive the ground signal to increase a shielding function.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
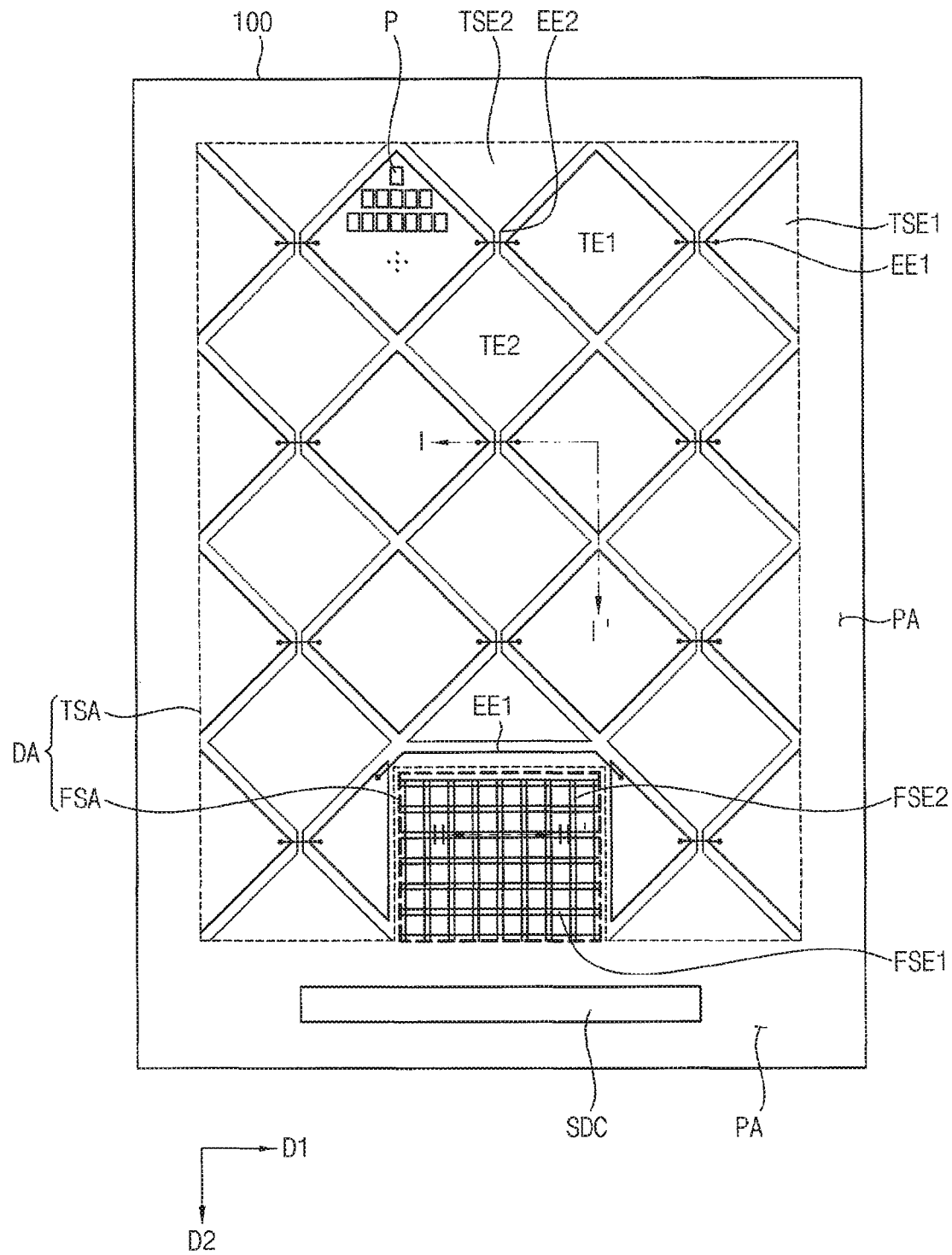
FIG. 1 is a plan view illustrating a touch display apparatus integrated fingerprint sensor according to an exemplary embodiment.

In the following description, for the purposes of explanation, numerous specific is details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, the inventive concepts will be explained in detail with reference to the accompanying drawings.

Figure 2:
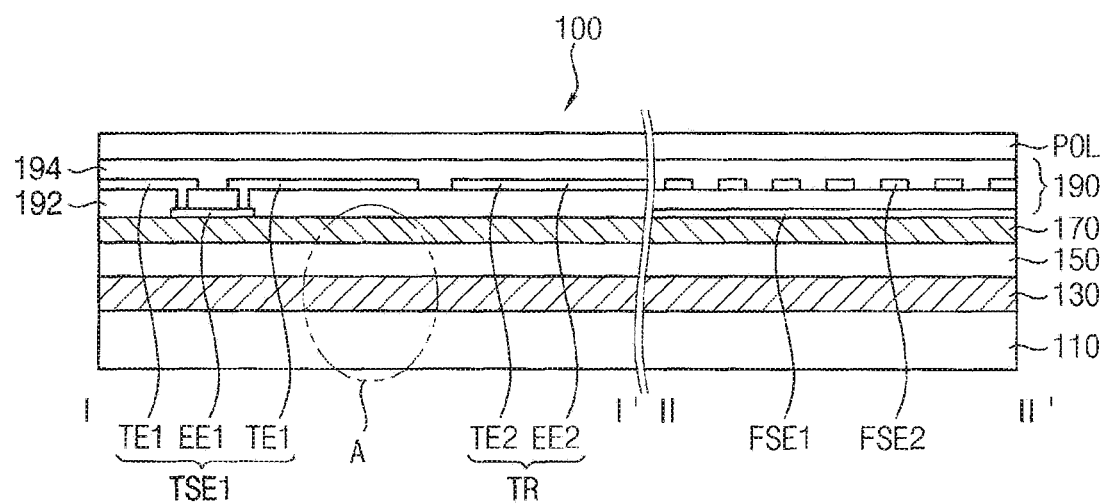
FIG. 2 is a cross-sectional view taken along a line I-I' and a line II-II' of FIG. 1 illustrating a touch display apparatus according to an exemplary embodiment.
Figure 3:
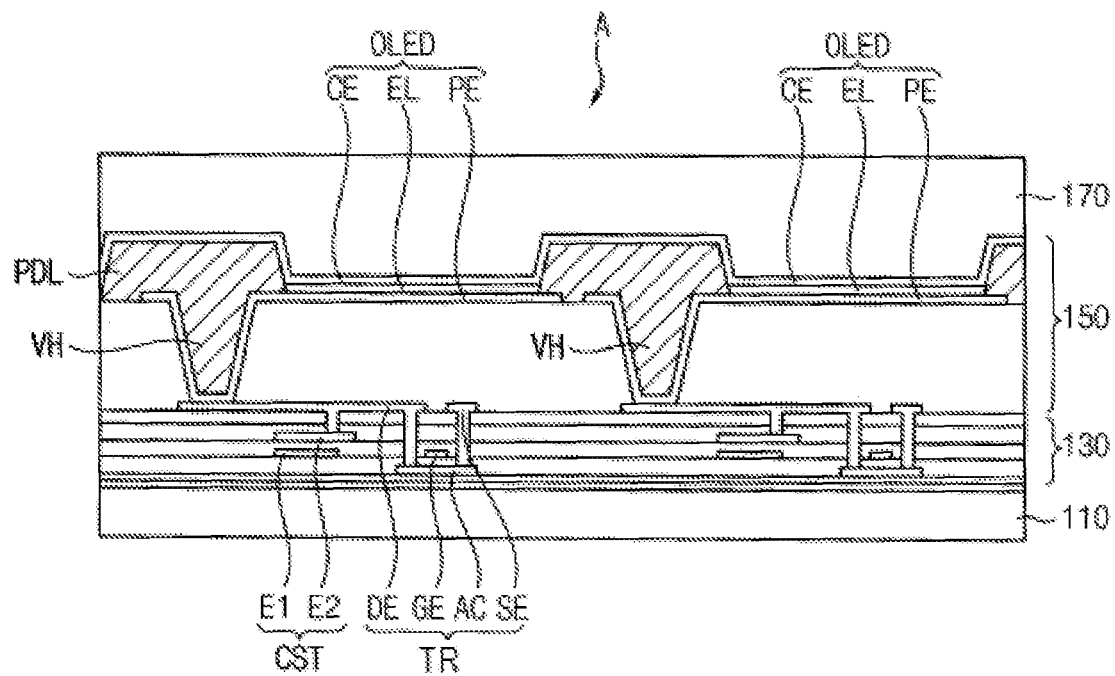
FIG. 3 is an enlarged view illustrating a portion A of FIG. 2.

FIG. 1 is a plan view illustrating a touch display apparatus integrated fingerprint sensor according to an exemplary embodiment. FIG. 2 is a cross-sectional view taken along a line I-I' and a line II-II' of FIG. 1 illustrating a touch display apparatus according to an exemplary embodiment. FIG. 3 is an enlarged view illustrating a portion A of FIG. 2.

Referring to FIG. 1, the touch display apparatus integrated fingerprint sensor 100 may include a display area DA and a peripheral area PA surrounding the display area DA.

A plurality of pixels P may be arranged in the display area DA and is configured to display an image.

Each of the plurality of pixels P may include a display element which displays a grayscale image and a pixel circuit which drives the display element. The display element may include an organic light emitting diode and a liquid crystal capacitor which display a grayscale using a light. According to one exemplary embodiment, the display element may be the organic light emitting diode which emits a grayscale light.

The display area DA may include a touch sensor area TSA in which a plurality of touch sensor electrodes may be arranged to sense a touch and a fingerprint sensor area FSA in which a plurality of fingerprint sensor electrodes may be arranged to sense a fingerprint.

The plurality of touch sensor electrodes may be a capacitance-type touch sensor, and may include a plurality of first touch sensor electrodes TSE1 and a plurality of second touch sensor electrodes TSE2.

The plurality of first touch sensor electrodes TSE1 may extend in a first direction D1 and be arranged line by line in a second direction D2 crossing the first direction D1 with respect to the touch sensor area TSA. The first touch sensor electrode TSE1 may include a plurality of first touch electrode patterns TE1 and a plurality of first connection patterns EE1.

The first touch electrode pattern TE1 may be formed from a second conductive layer and have a diamond shape. Although not shown in figures, the first touch electrode pattern may be formed of metal and have a mesh shape.

The plurality of first connection patterns EE1 may connect the plurality of first touch electrode patterns TE1 arranged in the first direction D1 to each other. A first connection pattern EE1 may be formed from a first conductive layer disposed on a different layer from the second conductive layer and may extend in the first direction D1 to connect the first touch electrode patterns TE1 to each other through a contact hole, such as a bridge electrode pattern.

However, a first connection pattern EE1 which is connected to the first touch electrode patterns TE1 spaced apart from each other in the first direction D1 by the fingerprint sensor area FSA, may be formed from the first conductive layer such as the bridge electrode pattern, or alternatively may be formed from the second conductive layer being the same as the first touch electrode pattern TE1 such as an electrode pattern.

The plurality of second touch sensor electrodes TSE2 may extend in the second direction D2 and may be arranged in the first direction D1. Each of the second touch sensor electrodes TES2 may include a plurality of second touch electrode patterns TE2 and a plurality of second connection patterns EE2.

The second touch electrode pattern TE2 may be formed from the second conductive layer and have a diamond shape. Although, not shown in figures, the second touch electrode pattern may be formed of metal and have a mesh shape.

The second connection pattern EE2 may connect the plurality of first touch electrode patterns TE1 arranged in the second direction D2 to each other. The second connection pattern EE2 may be formed from the second conductive layer being the same as the second touch electrode pattern TE.

The plurality of fingerprint sensor electrodes may be a capacitance-type fingerprint sensor, and may include a plurality of first fingerprint sensor electrodes FSE1 and a plurality of second fingerprint sensor electrodes FSE2.

The plurality of first fingerprint sensor electrodes FSE1 may extend in the first direction D1 and be arranged line by line in the second direction D2 crossing the first direction D1 with respect to the fingerprint sensor area FSA.

The plurality of first fingerprint sensor electrodes FSE1 may be formed from the first conductive layer. Although, not shown in figures, the first fingerprint sensor electrode FSE1 may include a plurality of diamond patterns which is connected to each other.

The plurality of second fingerprint sensor electrodes FSE2 may extend in the second direction D2 and be arranged line by line in the first direction D1.

The plurality of second fingerprint sensor electrodes FSE2 may be formed from the second conductive layer. Although, not shown in figures, the second fingerprint sensor electrode FSE2 may include a plurality of diamond patterns which is connected to each other.

A sensor driver circuit SDC may be disposed in the peripheral area PA. The sensor driver circuit SDC may be configured to transmit a touch driving signal to the first touch sensor electrode TSE1, and to detect a touch using a touch sensing signal received from the second touch sensor electrode TSE2. But not limited thereto, the sensor driver circuit SDC may be configured to transmit the touch driving signal to the second touch sensor electrode TSE2 and to detect a touch using the touch sensing signal received from the first touch sensor electrode TSE1.

In addition, the sensor driver circuit SDC may be configured to transmit a fingerprint driving signal to the first fingerprint sensor electrode FSE1 and to detect a fingerprint using a fingerprint sensing signal received from a second fingerprint sensor electrode FSE2. But not limited thereto, the sensor driver circuit SDC may be configured to transmit the fingerprint driving signal to the second fingerprint sensor electrode FSE2 and to detect a fingerprint using the fingerprint sensing signal received from the first fingerprint sensor electrode FSE1.

Referring to FIGS. 2 and 3, the touch display apparatus integrated fingerprint sensor may include a display element, a touch sensor electrode and a fingerprint sensor electrode which are disposed on a single base substrate.

For example, the touch display apparatus integrated fingerprint sensor may include a base substrate 110, a pixel circuit layer 130, a display element layer 150, an encapsulation layer 170 and a sensor layer 190.

The base substrate 110 may include a flexible substrate layer. The flexible substrate layer may be formed of polyimide, polyethylenenaphtalate, polyethyleneterephthalate, polyarylate, polycarbonate, polyrtherlmide or polyethersulfone, etc.

The pixel circuit layer 130 may be disposed on the base substrate 110 and include a transistor TR and a capacitor CST. The transistor TR may include an active pattern AC, a gate electrode GE, a source electrode SE and a drain electrode DE. The capacitor CST may include a first electrode E1 and a second electrode E2 which overlap with each other.

The display element layer 150 may include a pixel electrode PE, a pixel definition layer PDL, an organic light emitting layer EL and a common electrode CE. The pixel electrode PE may be connected to a transistor TR of the pixel circuit layer 130. The pixel definition layer PDL may be disposed on the pixel electrode PE and include an opening corresponding to an emission area. The organic light emitting layer EL may be disposed in the opening in the pixel definition layer PDL. The common electrode CE may be disposed on the organic light emitting layer EL. An organic light emitting diode OLED may be defined by the pixel electrode PE, the organic light emitting layer EL and the common electrode CE. The organic light emitting diode OLED may display a grayscale image using a brightness of the light.

The encapsulation layer 170 may be disposed on the common electrode CE and may include a plurality of inorganic layers or compound layers of the inorganic layer and organic layer. The encapsulation layer 170 may level a surface of the touch display apparatus integrated fingerprint sensor.

The sensor layer 190 may include a first conductive layer, a first insulating layer 192, a second conductive layer and a second insulating layer 194.

The first conductive layer may be disposed on the encapsulation layer 170 and include a first connection pattern EE1 and a first fingerprint sensor electrode FSE1. The first conductive layer may have a conductivity being different from a finger such that interference by the touched finger may decrease in a fingerprint sensor mode.

The first insulating layer 192 may be disposed on the first conductive layer.

The second conductive layer may be disposed on the first insulating layer 192 and include the first touch sensor electrode TSE1, the second touch sensor electrode TSE2 and the second connection pattern EE2. The second conductive layer may have a conductivity being substantially the same as the finger such that touch sensitivity by the touched finger may increase in a touch sensor mode.

The touch display apparatus integrated fingerprint sensor may further include a polarizing layer POL which is disposed on the sensor layer 190.

Figure 4:
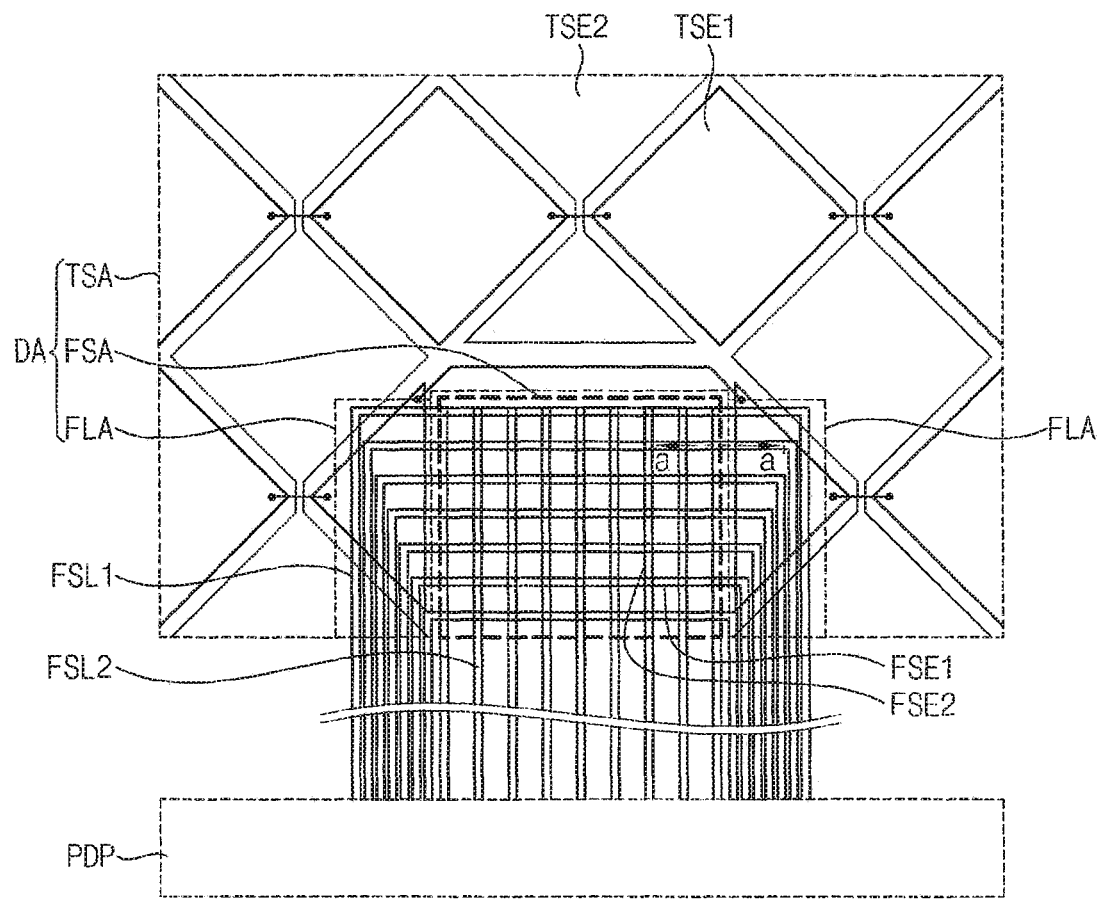
FIG. 4 is an enlarged plan view illustrating a touch display apparatus integrated fingerprint sensor according to an exemplary embodiment.
Figure 5:
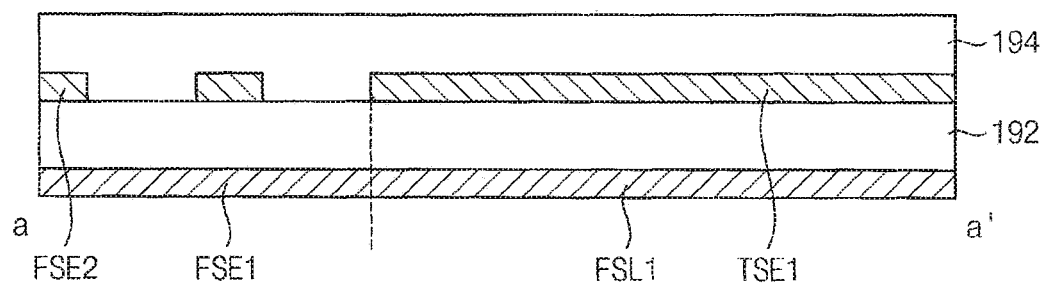
FIG. 5 is a cross-sectional view taken along a line a-a' of FIG. 4 illustrating a touch display apparatus according to an exemplary embodiment.

FIG. 4 is an enlarged plan view illustrating a touch display apparatus integrated fingerprint sensor according to an exemplary embodiment. FIG. 5 is a cross-sectional view taken along a line a-a' of FIG. 4 illustrating a touch display apparatus according to an exemplary embodiment.

Referring to FIGS. 1, 4 and 5, the touch display apparatus integrated fingerprint sensor may include a display area DA and a peripheral area PA surrounding the display area DA.

The display area DA may include a fingerprint sensor area FSA, a touch sensor area TSA and a fingerprint line area FLA.

A pad part PDP may be disposed on the peripheral area PA and be connected to the sensor driver circuit SDC.

A plurality of fingerprint sensor electrodes FSE1 and FSE2 may be arranged in the fingerprint sensor area FSA.

A plurality of touch sensor electrodes TSE1 and TSE2 may be arranged in the touch sensor area TSA.

The fingerprint line area FLA may be included in the touch sensor area TSA corresponding to an edge area of the fingerprint sensor area F SA.

A plurality of fingerprint lines may be arranged in the fingerprint line area FLA and be associated with driving of the plurality of fingerprint sensor electrodes FSE1 and FSE2.

For example, as shown in FIG. 4, the plurality of fingerprint lines may include a plurality of first fingerprint sensor lines FSL1 and the first fingerprint sensor lines FSL1 may be arranged in the fingerprint line area FLA of the touch sensor area TSA.

The first fingerprint sensor line FSL1 may be respectively connected to a first end portion and a second end portion of the first fingerprint sensor electrode FSE1. The first fingerprint sensor lines FSL1 may be respectively arranged in a first side portion corresponding to the first end portion of the fingerprint sensor area FSA and a second side portion corresponding to the second end portion of the fingerprint sensor area FSA.

The first fingerprint sensor line FSL1 may be formed from the first conductive layer, like the first fingerprint sensor electrode FSE1.

The first fingerprint sensor lines FSL1 formed from the first conductive layer may be disposed under the touch sensor electrodes TSE1 and TSE2 formed from the second conductive layer. The touch sensor electrodes TSE1 and TSE2 may shield the first fingerprint sensor lines FSL1 from interference by the contacting finger.

The second fingerprint sensor lines FSL2 may be formed from the second conductive layer, like the second fingerprint sensor electrodes FSE2.

The second fingerprint sensor line FSL2 may be disposed in a peripheral area PA between the fingerprint sensor area FSA and the pad part PDP.

According to one exemplary embodiment, in the fingerprint sensor mode, when the finger is contacting the fingerprint line area, the touch sensor electrodes shield the first fingerprint sensor lines from interference by the contacting finger and thus errors of detecting the fingerprint may be avoided.

Figure 6:
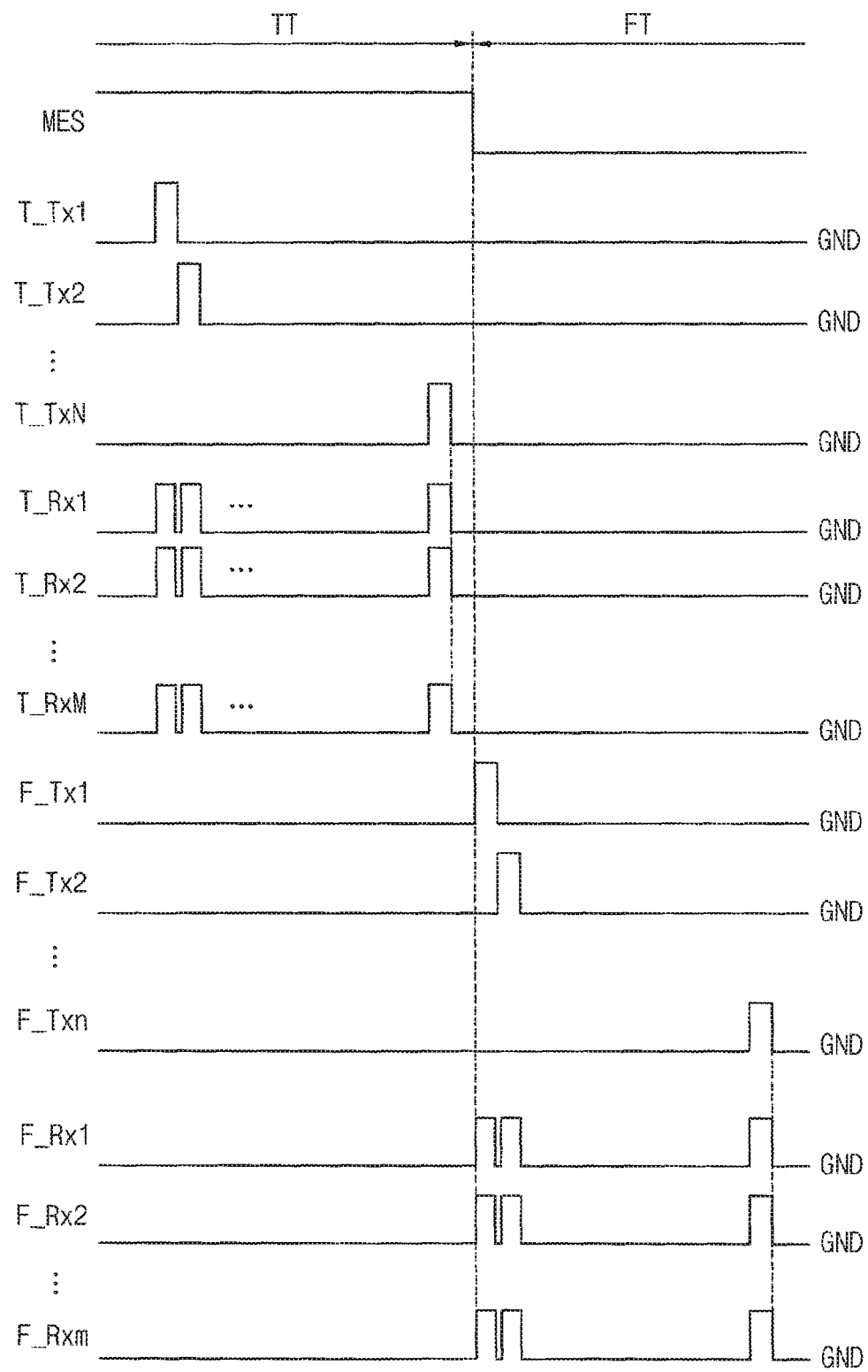
FIG. 6 is a waveform diagram illustrating a method of driving a touch display apparatus according to an exemplary embodiment.

FIG. 6 is a waveform diagram illustrating a method of driving a touch display apparatus according to an exemplary embodiment.

Referring to FIGS. 1 and 6, the sensor driver circuit SDC may be configured to drive with a touch sensor mode corresponding to a touch sensor period TT in which a touch is detected and a fingerprint sensor mode corresponding to a fingerprint sensor period FT in which a fingerprint is detected based on a mode enable signal MES.

During the touch sensor period TT, the sensor driver circuit SDC may be configured to provide the first touch sensor electrodes TSE1 and the second touch sensor electrodes TSE2 with a touch driving signal during the touch sensor period TT. The sensor driver circuit SDC may be configured to provide the first fingerprint sensor electrodes FSE1 and the second fingerprint sensor electrodes FSE2 with a ground signal GND.

For example, during the touch sensor period TT, the sensor driver circuit SDC may be configured to sequentially provide N first touch sensor electrodes TSE1 arranged in the second direction D2 with first to n-th touch driving signal T_Tx1, T_Tx2, T_Tx3, . . . , T_TxN. Each of the first to n-th touch driving signals T_Tx1, T_Tx2, T_Tx3, . . . , T_TxN may have at least one pulse in a horizontal period H.

The sensor driver circuit SDC may be configured to provide M second touch sensor electrodes TSE2 arranged in the first direction D1 with a bias signal such as a ground voltage or a DC voltage having a predetermined level. When the bias signal is proved, the sensor driver circuit SDC may be configured to receive first to M-th touch sensing signals T_Rx1, T_Rx2, T_Rx3, . . . , T_RxM from the second touch sensor electrodes TSE2.

The sensor driver circuit SDC may be configured to detect a touch based on the first to M-th touch sensing signals T_T_Rx2, T_Rx3, . . . , T_RxM.

However, during the touch sensor period TT, the sensor driver circuit SDC may be configured to provide n first fingerprint sensor electrodes FSE1 arranged in the second direction D2 with the ground signal GND. In addition, the sensor driver circuit SDC may be configured to provide m second fingerprint sensor electrodes FSE2 arranged in the first direction D1 with the ground signal GND.

Therefore, the ground signal GND is applied to the fingerprint sensor lines FSL1 and FSL2 and thus interference of the fingerprint sensor lines FSL1 and FSL2 may be removed in the touch sensor mode.

Then, during the fingerprint sensor period FT, the sensor driver circuit SDC may be configured to provide the first fingerprint sensor electrodes FSE1 and the second fingerprint sensor electrodes FSE2 with a fingerprint driving signal and provide the first touch sensor electrodes TSE1 and the second touch sensor electrodes TSE2 with the ground signal GND.

For example, during the fingerprint sensor period FT, the sensor driver circuit SDC may be configured to sequentially provide n first fingerprint sensor electrodes FSE1 arranged in the second direction D2 with first to n-th touch driving signal F_Tx1, F_Tx2, F_Tx3, . . . , F_Txn. Each of the first to n-th fingerprint driving signal F_Tx1, F_Tx2, F_Tx3, . . . , F_Txn may have at least one pulse in a horizontal period H.

The sensor driver circuit SDC may be configured to provide m second fingerprint sensor electrodes FSE2 arranged in the first direction D1 with the bias signal such as the ground voltage GND or the DC voltage having the predetermined level. When the bias signal is applied to the second fingerprint sensor electrodes FSE2, the sensor driver circuit SDC may be configured to receive the first to m-th fingerprint sensing signals F_Rx1, F_Rx2, F_Rx3, . . . , F_Rxm from the second fingerprint sensor electrodes FSE2.

The sensor driver circuit SDC may be configured to detect the fingerprint based on the first to m-th fingerprint sensing signals F_Rx1, F_Rx2, F_Rx3, . . . , F_Rxm.

However, during the fingerprint sensor period FT, the sensor driver circuit SDC may be configured to provide N first touch sensor electrodes TSE1 arranged in the second direction D2 with the ground signal GND. In addition, the sensor driver circuit SDC may be configured to provide M second touch sensor electrodes FSE2 arranged in the first direction D1 with the ground signal GND.

Therefore, the ground signal GND is applied to the touch sensor electrodes TSE1 and TSE2 and thus, the interference of the touch sensor electrodes TSE1 and TSE2 may be removed in the fingerprint sensor mode.

According to the exemplary embodiment, in the fingerprint sensor mode, when the finger is contacting the fingerprint line area, the touch sensor electrodes having the ground signal shield the first fingerprint sensor lines from interference by the contacting finger and thus errors of detecting the fingerprint may be avoided.

Figure 7:
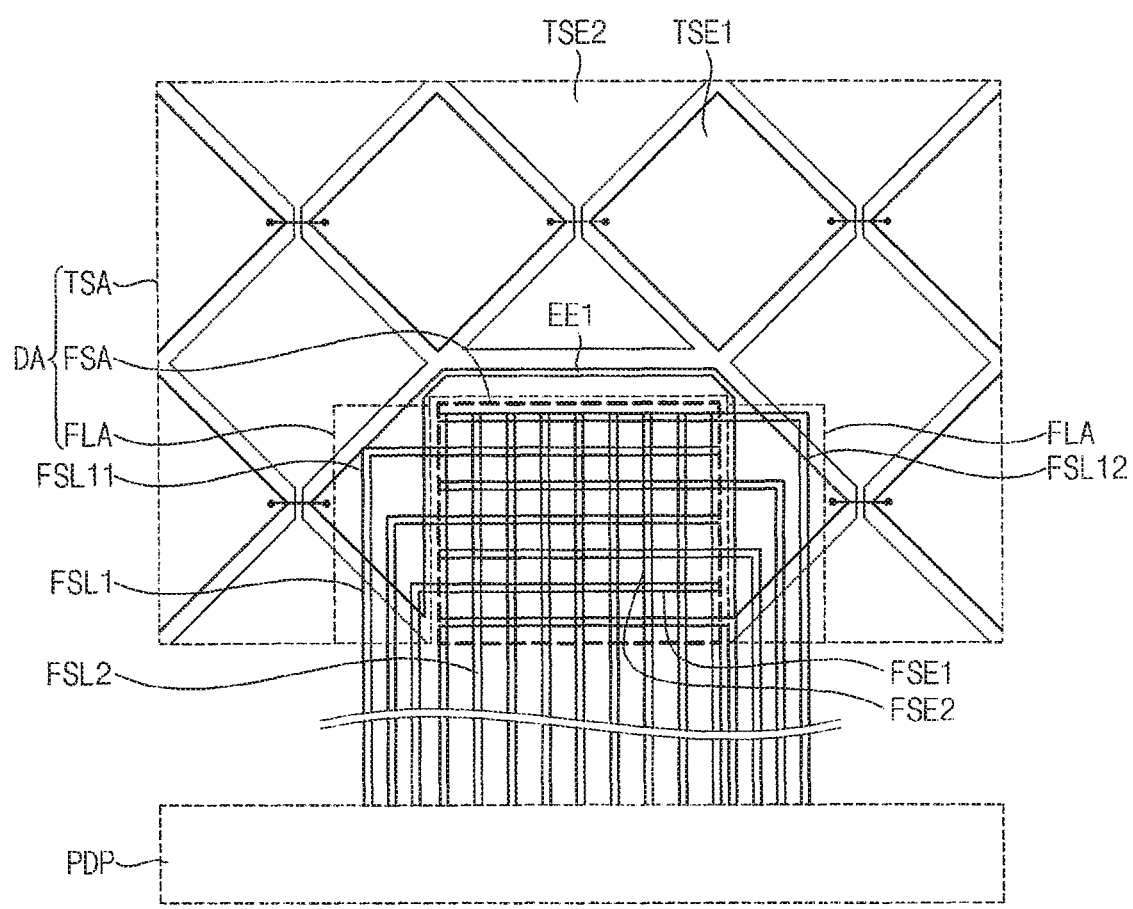
FIG. 7 is an enlarged plan view illustrating a touch display apparatus integrated fingerprint sensor according to an exemplary embodiment.

FIG. 7 is an enlarged plan view illustrating a touch display apparatus integrated fingerprint sensor according to an exemplary embodiment.

Referring to FIGS. 1, 5 and 7, the touch display apparatus integrated fingerprint sensor may include a display area DA and a peripheral area PA surrounding the display area DA.

The display area DA may include a fingerprint sensor area FSA, a touch sensor area TSA and a fingerprint line area FLA.

A pad part PDP may be disposed in the peripheral area PA and connected to a sensor driver circuit SDC.

A plurality of fingerprint sensor electrodes FSE1 and FSE2 may be arranged in the fingerprint sensor area FSA.

A plurality of touch sensor electrodes TSE1 and TSE2 may be arranged in the touch sensor area TSA.

The fingerprint line area FLA may be located in the touch sensor area TSA corresponding to an edge area of the fingerprint sensor area F SA.

A plurality of fingerprint lines may be associated with driving of the plurality of fingerprint sensor electrodes FSE1 and FSE2 and may be arranged in the fingerprint line area FLA.

For example, as shown in FIG. 4, the plurality of fingerprint lines may include a plurality of first fingerprint sensor lines FSL1, and the first fingerprint sensor lines FSL1 may be disposed in the fingerprint line area FLA of the touch sensor area TSA.

The first fingerprint sensor lines FSL1 may be connected to the first fingerprint sensor electrodes FSE1 and be formed from the first conductive layer being the same as the first fingerprint sensor electrodes FSE1.

An odd numbered fingerprint sensor line FSL11 among the first fingerprint sensor lines FSL1 may be connected to an odd numbered fingerprint sensor electrode and an even numbered fingerprint sensor line FSL12 among the first fingerprint sensor lines FSL1 may be connected to an even numbered fingerprint sensor electrode.

As shown in FIG. 7, the odd numbered fingerprint sensor line FSL11 may be arranged in a first side portion of the fingerprint sensor area FSA and the even numbered fingerprint sensor line FSL12 may be arranged in a second side portion opposite to the first side portion of the fingerprint sensor area FSA.

The first fingerprint sensor line FSL1 formed from the first conductive layer may be disposed under the touch sensor electrodes TSE1 and TSE2 formed from the second conductive layer. The touch sensor electrodes TSE1 and TSE2 may shield the first fingerprint sensor lines FSL1 from interference by the contacting finger.

The second fingerprint sensor line FSL2 may be formed from the second conductive layer, like the second fingerprint sensor electrode FSE2.

The second fingerprint sensor line FSL2 may be disposed in a peripheral area PA between the fingerprint sensor area FSA and the pad part PDP.

According to the exemplary embodiment, in the fingerprint sensor mode, when the finger is contacting the fingerprint line area, the touch sensor electrodes shield the first fingerprint sensor lines from interference by the contacting finger and thus errors of detecting the fingerprint may be avoided.

Figure 8:
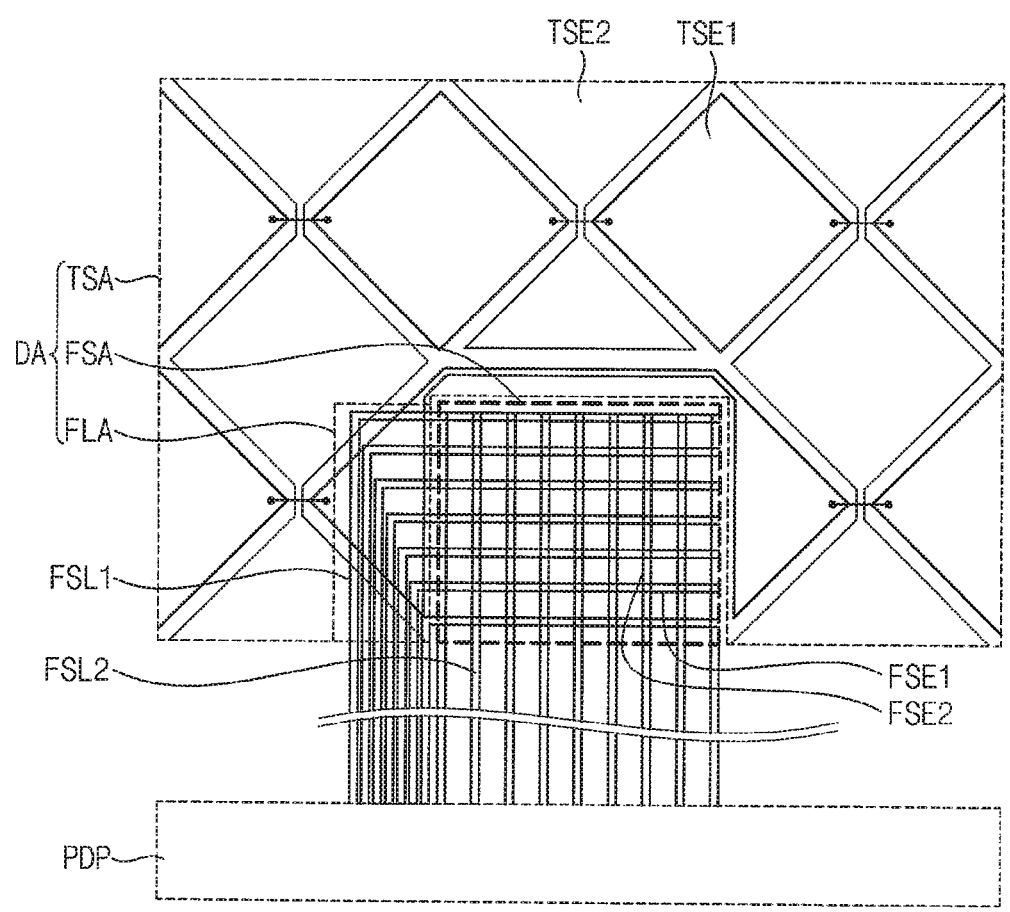
FIG. 8 is an enlarged plan view illustrating a touch display apparatus integrated fingerprint sensor according to an exemplary embodiment.

FIG. 8 is an enlarged plan view illustrating a touch display apparatus integrated fingerprint sensor according to an exemplary embodiment.

Referring to FIGS. 1, 5 and 8, the touch display apparatus integrated fingerprint sensor may include a display area DA and a peripheral area PA surrounding the display area DA.

A pad part PDP may be disposed in the peripheral area PA and connected to a sensor driver circuit SDC.

The display area DA may include a fingerprint sensor area FSA, a touch sensor area TSA and a fingerprint line area FLA.

A plurality of fingerprint sensor electrodes FSE1 and FSE2 may be arranged in the fingerprint sensor area FSA.

A plurality of touch sensor electrodes TSE1 and TSE2 may be arranged in the touch sensor area TSA.

The fingerprint line area FLA may overlap with a partial area of the touch sensor area TSA corresponding to an edge area of the fingerprint sensor area FSA.

A plurality of fingerprint lines may be associated with driving of the plurality of fingerprint sensor electrodes FSE1 and FSE2 and may be arranged in the fingerprint line area FLA.

For example, as shown in FIG. 4, the plurality of fingerprint lines may include a plurality of first fingerprint sensor lines FSL1, and the first fingerprint sensor lines FSL1 may be disposed in the fingerprint line area FLA of the touch sensor area TSA.

The first fingerprint sensor lines FSL1 may be connected to the first fingerprint sensor electrodes FSE1 and be formed from the first conductive layer, like the first fingerprint sensor electrodes FSE1.

The first fingerprint sensor lines FSL1 may be disposed in one of a first side portion and a second side portion opposite to the first side portion of the fingerprint sensor area FSA.

As shown in FIG. 8, the first fingerprint sensor line FSL1 may be connected to one of first and second end portions of the first fingerprint sensor electrode FSE1. The fingerprint sensor lines FSL1 may be arranged in one of both side portions of the fingerprint sensor area FSA.

The first fingerprint sensor line FSL1 formed from the first conductive layer may be disposed under the touch sensor electrodes TSE1 and TSE2 formed from the second conductive layer. The touch sensor electrodes TSE1 and TSE2 may shield the first fingerprint sensor lines FSL1 from interference by the contacting finger.

The second fingerprint sensor electrode FSE2 may be connected to the second fingerprint sensor line FSL2 and be formed from the second conductive layer, like the second fingerprint sensor electrode FSE2.

The second fingerprint sensor line FSL2 may be disposed in a peripheral area PA between the fingerprint sensor area FSA and the pad part PDP.

According to the exemplary embodiment, in the fingerprint sensor mode, when the finger is contacting in the fingerprint line area, the touch sensor electrodes shield the first fingerprint sensor lines from interference by the contacting finger and thus errors of detecting the fingerprint may be avoided.

Figure 9:
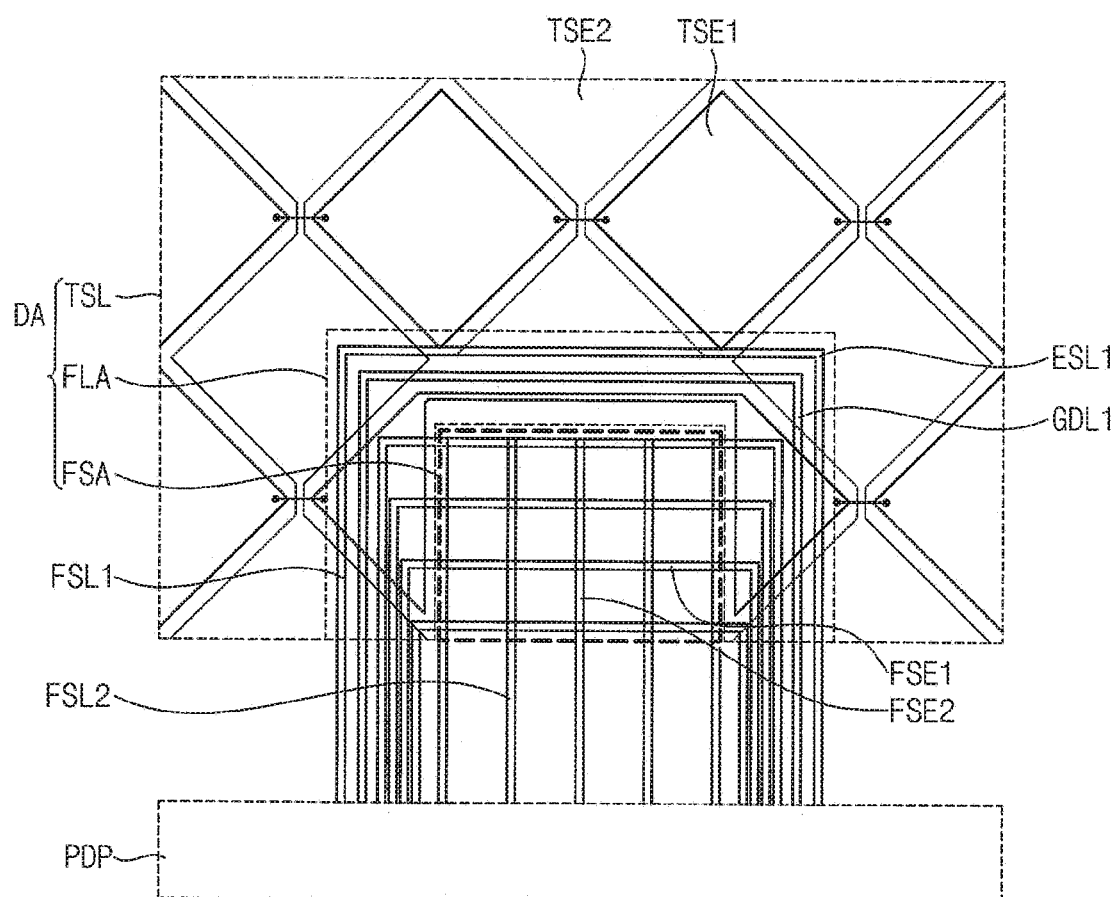
FIG. 9 is an enlarged plan view illustrating a touch display apparatus integrated fingerprint sensor according to an exemplary embodiment.

FIG. 9 is an enlarged plan view illustrating a touch display apparatus integrated fingerprint sensor according to an exemplary embodiment.

Referring to FIGS. 1, 5 and 9, the touch display apparatus integrated fingerprint sensor may include a display area DA and a peripheral area PA surrounding the display area DA.

The display area DA may include a fingerprint sensor area FSA, a touch sensor area TSA and a fingerprint line area FLA.

A pad part PDP may be disposed in the peripheral area PA and connected to a sensor driver circuit.

A plurality of fingerprint sensor electrodes FSE1 and FSE2 may be arranged in the fingerprint sensor area FSA.

A plurality of touch sensor electrodes TSE1 and TSE2 may be arranged in the touch sensor area TSA.

The fingerprint line area FLA may overlap with a partial area of the touch sensor area TSA corresponding to an edge area of the fingerprint sensor area FSA.

A plurality of fingerprint lines may be associated with driving of the plurality of fingerprint sensor electrodes FSE1 and FSE2 and may be arranged in the fingerprint line area FLA.

For example, as shown in FIG. 9, the plurality of fingerprint lines may include a first fingerprint sensor line FSL1, a fingerprint guard line GDL1 and a fingerprint electrostatic line ESL1. The first fingerprint sensor line F SL1, the fingerprint guard line GDL1 and the fingerprint electrostatic line ESL1 may be disposed in a fingerprint line area FLA of the touch sensor area TSA.

The first fingerprint sensor lines FSL1 may be connected to the first fingerprint sensor electrodes FSE1 and be formed from the first conductive layer being same as the first fingerprint sensor electrodes FSE1.

The first fingerprint sensor line FSL1 may be respectively connected to a first end portion and a second end portion of the first fingerprint sensor electrode FSE1. The first fingerprint sensor lines FSL1 may be arranged in the fingerprint sensor area FSA respectively corresponding to the first end portion and the second end portion.

The first fingerprint sensor line FSL1 formed from the first conductive layer may be disposed under the touch sensor electrodes TSE1 and TSE2 formed from the second conductive layer. The touch sensor electrodes TSE1 and TSE2 may shield the first fingerprint sensor lines FSL1 from interference by the contacting finger.

The fingerprint guard line GDL1 may be formed from the first conductive layer and the fingerprint guard line GDL1 may surround the fingerprint sensor area FSA.

The fingerprint guard line GDL1 may be connected to the pad part PDP. The fingerprint guard line GDL1 may be configured to receive the ground signal GND and may prevent external signals from interfering with the first and second fingerprint sensor electrodes FSE1 and FSE2.

The fingerprint electrostatic line ESL1 may be formed from the first conductive layer. The fingerprint electrostatic line ESL1 may be adjacent to the fingerprint guard line GDL1 and may surround the fingerprint sensor area FSA.

The fingerprint electrostatic line ESL1 may be connected to the pad part PDP. The fingerprint electrostatic line ESL1 may be configured to receive the ground signal GND and shield the first and second fingerprint sensor electrodes FSE1 and FSE2 from electrostatic discharge.

The second fingerprint sensor electrode FSE2 may be connected to the second fingerprint sensor line FSL2 and be formed from the second conductive layer being the same as the second fingerprint sensor electrode FSE2.

The second fingerprint sensor line FSL2 may be disposed in a peripheral area PA between the fingerprint sensor area FSA and the pad part PDP.

According to the exemplary embodiment, in the fingerprint sensor mode, when the finger is contacting the fingerprint line area, the touch sensor electrodes shield the first fingerprint sensor lines from interference by the contacting finger and thus errors of detecting the fingerprint may be avoided.

Hereinafter, the same reference numerals will be used to refer to the same or like parts as those described in the previous exemplary embodiments, and any repetitive detailed explanation will be omitted.

Figure 10:
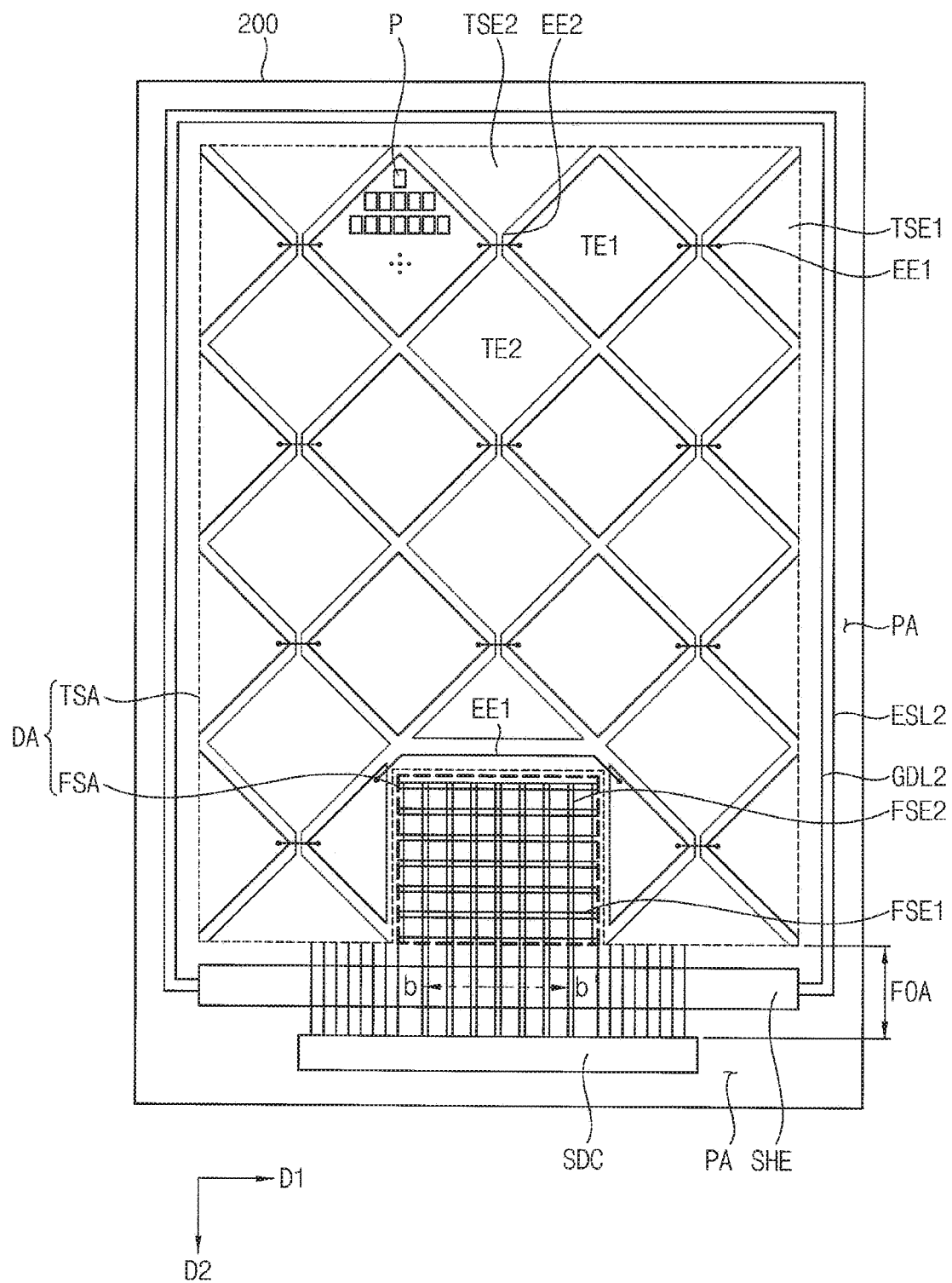
FIG. 10 is a plan view illustrating a touch display apparatus integrated fingerprint sensor according to an exemplary embodiment.
Figure 11:
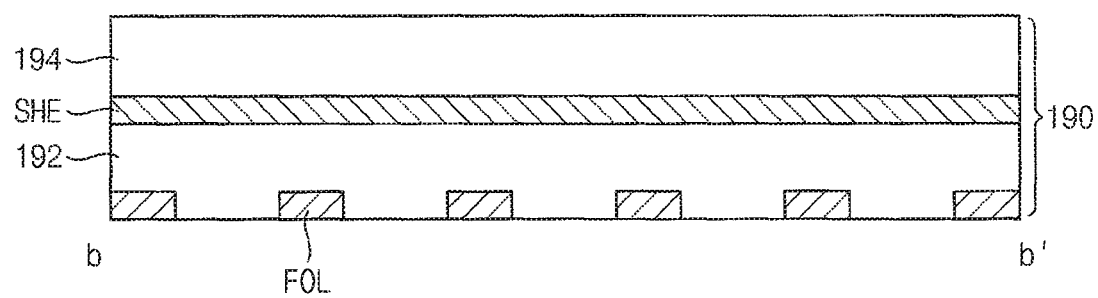
FIG. 11 is a cross-sectional view taken along a line b-b' of FIG. 10 illustrating a touch display apparatus according to an exemplary embodiment.

FIG. 10 is a plan view illustrating a touch display apparatus integrated fingerprint sensor according to an exemplary embodiment. FIG. 11 is a cross-sectional view taken along a line b-b' of FIG. 10 illustrating a touch display apparatus according to an exemplary embodiment.

Referring to FIGS. 10 and 11, the touch display apparatus integrated fingerprint sensor 200 may include a display area DA and a peripheral area PA surrounding the display area DA.

In addition, the touch display apparatus integrated fingerprint sensor 200 may include a base substrate 110, a pixel circuit layer 130, a display element layer 150, an encapsulation layer 170 and a sensor layer 190 which are the same or like parts as those of the touch display apparatus 100 described in the previous example embodiment referring to FIG. 2.

A plurality of pixels P may be arranged in the display area DA and is configured to display an image.

The display area DA may include a touch sensor area TSA in which a plurality of touch sensor electrodes may be arranged to sense a touch and a fingerprint sensor area FSA in which a plurality of fingerprint sensor electrodes may be arranged to sense a fingerprint. The fingerprint sensor area FSA may be variously disposed in the display area DA.

A plurality of touch sensor electrodes may include a first touch sensor electrode TSE1 and a second touch sensor electrode TSE2 crossing the first touch sensor electrode TSE1.

The plurality of first touch sensor electrodes TSE1 may extend in a first direction D1 and be arranged line by line in a second direction D2 crossing the first direction D1 with respect to the touch sensor area TSA. The first touch sensor electrode TSE1 may include a plurality of first touch electrode patterns TE1 and a plurality of first connection patterns EE1.

The plurality of second touch sensor electrodes TSE2 may extend in the second direction D2 and may be arranged line by line in the first direction D1. Each of the second touch sensor electrodes TES2 may include a plurality of second touch electrode patterns TE2 and a plurality of second connection patterns EE2.

The plurality of fingerprint sensor electrodes may include a plurality of first fingerprint sensor electrodes FSE1 and a plurality of second fingerprint sensor electrodes FSE2.

The plurality of first fingerprint sensor electrodes FSE1 may extend in the first direction D1 and be arranged in the second direction D2 crossing the first direction D1 with respect to the fingerprint sensor area FSA. The plurality of first fingerprint sensor electrodes FSE1 may be formed from the first conductive layer. Although, not shown in figures, the first fingerprint sensor electrode FSE1 may include a plurality of diamond patterns which is connected to each other.

The plurality of second fingerprint sensor electrodes FSE2 may extend in the second direction D2 and be arranged line by line in the first direction D1. The plurality of second fingerprint sensor electrodes FSE2 may be formed from the second conductive layer. Although, not shown in figures, the second fingerprint sensor electrode FSE2 may include a plurality of diamond patterns which is connected to each other.

A sensor driver circuit SDC, a touch guard line GDL2, a touch electrostatic line ESL2 and a shielding electrode SHE may be disposed in the peripheral area PA.

The sensor driver circuit SDC may be configured to transmit a touch driving signal to the first touch sensor electrode TSE1, and to detect a touch using a touch sensing signal received from the second touch sensor electrode TSE2. But not limited thereto, the sensor driver circuit SDC may be configured to transmit the touch driving signal to the second touch sensor electrode TSE2 and to detect a touch using the touch sensing signal received from the first touch sensor electrode TSE1.

In addition, the sensor driver circuit SDC may be configured to transmit a fingerprint driving signal to the first fingerprint sensor electrode FSE1 and to detect a fingerprint using the fingerprint sensing signal received from the second fingerprint sensor electrode FSE2. But not limited thereto, the sensor driver circuit SDC may be configured to transmit the fingerprint driving signal to the second fingerprint sensor electrode FSE2 and to detect a fingerprint using the fingerprint sensing signal received from the first fingerprint sensor electrode FSE1.

The touch guard line GDL2 may be disposed in an edge area of the touch sensor area TSA in which the touch sensor electrodes TSE1 and TSE2 are arranged. The touch guard line GDL2 may be connected to the sensor driver circuit SDC which is disposed in the peripheral area PA. The touch guard line GDL2 may be configured to receive the ground signal GND and may prevent external signals from interfering with the touch sensor electrodes TSE1 and TSE2. The touch guard line GDL2 may be formed from the first or second conductive layer.

The touch electrostatic line ESL2 may be adjacent to the touch guard line GDL2 and disposed in an edge area of the touch sensor area TSA. The touch electrostatic line ESL2 may be connected to the sensor driver circuit SDC which is disposed in the peripheral area PA. The touch electrostatic line ESL2 may be configured to receive the ground signal GND and may shield the touch sensor electrodes TSE1 and TSE2 from electrostatic discharge. The touch electrostatic line ESL2 may be formed from the first or second conductive layer.

Referring to FIG. 11, the shielding electrode SHE may be disposed in a fan-out area FOA between the display area DA and the sensor driver circuit SDC.

The shielding electrode SHE may be formed from the second conductive layer.

The shielding electrode SHE may be connected to at least one of the touch guard line GDL2 and the touch electrostatic line ESL2. Thus, the shielding electrode SHE may be configured to receive the ground signal GND.

A plurality of fan-out lines FOL may be connected to the touch and fingerprint sensor electrodes TSE1, TSE2, FSE1 and FSE2 and the pad part PDP and may be arranged in the fan-out area FOA. The fan-out lines FOL arranged in the fan-out area FOA may be formed from the first conductive layer.

A first insulating layer 192 may be disposed on the fan-out lines FOL formed from the first conductive layer and a second insulating layer 194 may be disposed on the shielding electrode SHE formed from the second conductive layer.

Therefore, the shielding electrode SHE may shield the fan-out line of the fingerprint sensor line from interference by the contacting finger.

According to the exemplary embodiment, in the fingerprint sensor mode, when is the finger is contacting the fingerprint line area, the touch sensor electrodes shield the first fingerprint sensor lines from interference by the contacting finger and thus errors of detecting the fingerprint may be avoided.

Figure 12:
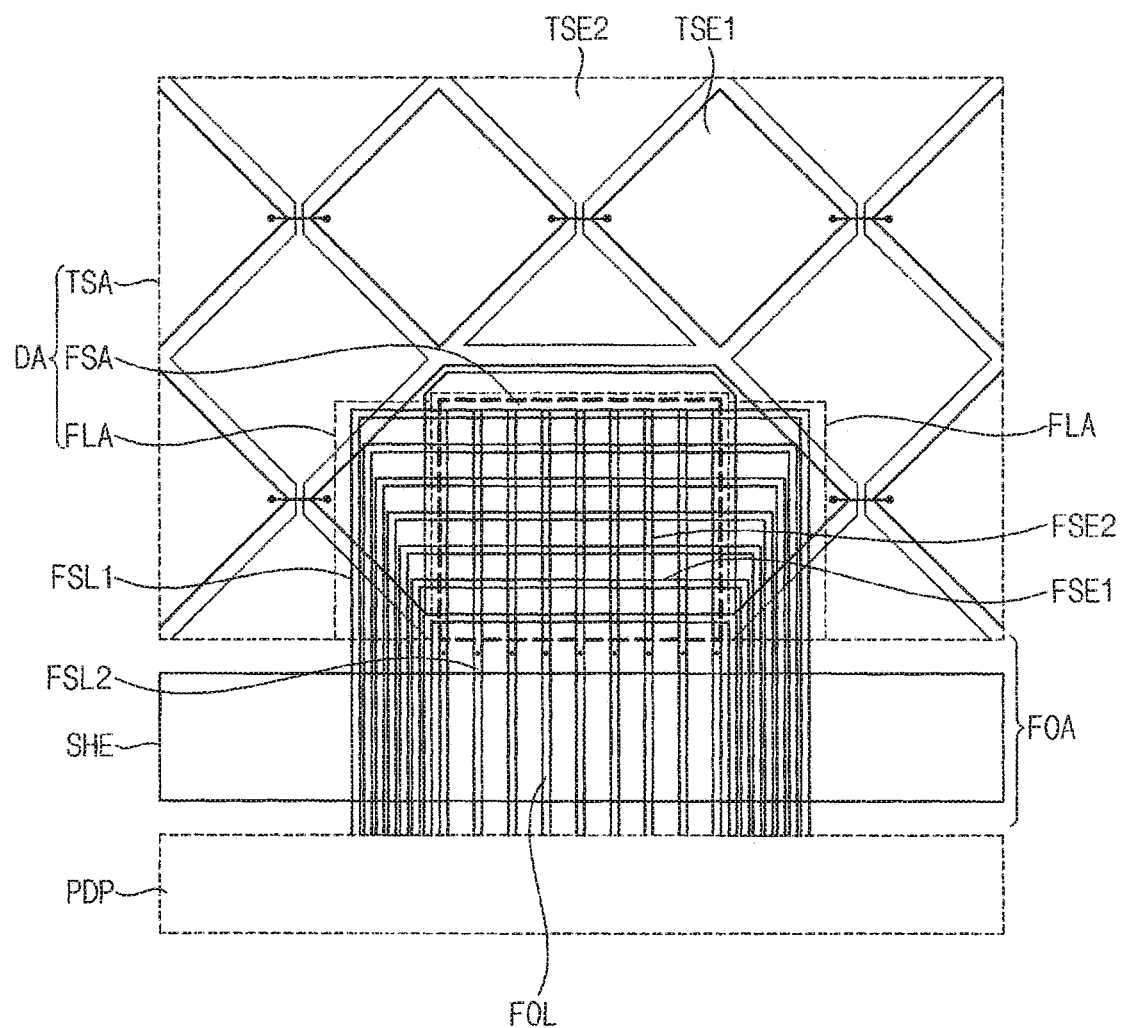
FIG. 12 is an enlarged plan view illustrating a touch display apparatus integrated fingerprint sensor according to an exemplary embodiment.

FIG. 12 is an enlarged plan view illustrating a touch display apparatus integrated fingerprint sensor according to an exemplary embodiment.

Referring to FIGS. 10 and 12, the touch display apparatus integrated fingerprint sensor may include a display area DA and a peripheral area PA surrounding the display area DA.

The display area DA may include a fingerprint sensor area FSA, a touch sensor area TSA and a fingerprint line area FLA.

The peripheral area PA may include a fan-out area FOA disposed between a pad part PDP connected to a sensor driver circuit and the display area DA.

A plurality of fingerprint sensor electrodes FSE1 and FSE2 may be arranged in the fingerprint sensor area FSA.

A plurality of touch sensor electrodes TSE1 and TSE2 may be arranged in the touch sensor area TSA.

The fingerprint line area FLA may overlap with a partial area of the touch sensor area TSA corresponding to an edge area of the fingerprint sensor area FSA.

A plurality of fingerprint lines may be arranged in the fingerprint line area FLA and be associated with driving of the plurality of fingerprint sensor electrodes FSE1 and FSE2.

For example, the plurality of fingerprint lines may include a plurality of first fingerprint sensor lines FSL1, and the first fingerprint sensor lines FSL1 may be arranged in the fingerprint line area FLA of the touch sensor area TSA.

Although not shown in FIGS. 10 and 12, a fingerprint guard line GDL1 and a fingerprint electrostatic line ESL1 may be further disposed in the fingerprint line area FLA as shown in FIG. 9.

The first fingerprint sensor line FSL1 may be formed from the first conductive layer, like the first fingerprint sensor electrode FSE1.

The first fingerprint sensor line FSL1 may be respectively connected to a first end portion and a second end portion of the first fingerprint sensor electrode FSE1 extending in a first direction D1. The first fingerprint sensor lines FSL1 may be respectively arranged in a first side portion corresponding to the first end portion of the fingerprint sensor area FSA and a second side portion corresponding to the second end portion of the fingerprint sensor area FSA.

The second fingerprint sensor line FSL2 may be connected to the second fingerprint sensor electrode FSE2 and may be formed from the second conductive layer, like the second fingerprint sensor electrode FSE2.

The second fingerprint sensor line FSL2 may be disposed in the fan-out area FOA between the fingerprint sensor area FSA and the pad part PDP.

A plurality of fan-out lines FOL and a shielding electrode SHE may be disposed in the fan-out area FOA.

The plurality of fan-out lines FOL may include first end portions connected to the first and second fingerprint sensor lines FSL1 and FSL2 and second end portions connected to the pad part PDP.

The fan-out lines FOL may be formed from the first conductive layer. The second fingerprint sensor lines FSL2 may be formed from the second conductive layer being different from the fan-out lines FOL and thus, the second fingerprint sensor lines FSL2 may be connected to the fan-out lines FOL through a contact hole.

The shielding electrode SHE may be disposed in the fan-out area FOA in which the fan-out lines FOL are disposed and thus, the shielding electrode SHE may be disposed on the fan-out lines FOL.

The shielding electrode SHE may be formed from the second conductive layer and may cover over the fan-out lines FOL.

The shielding electrode SHE may be connected to at least one of the touch guard line GDL2 and the touch electrostatic line ESL2 and be configured to receive the ground signal GND.

Therefore, the shielding electrode SHE may shield the fan-out lines FOL of the fingerprint sensor lines from interference by the contacting finger.

According to the exemplary embodiment, in the fingerprint sensor mode, when the finger is contacting the fingerprint line area, the touch sensor electrodes shield the first fingerprint sensor lines from interference by the contacting finger and thus errors of detecting the fingerprint may be avoided.

Figure 13:
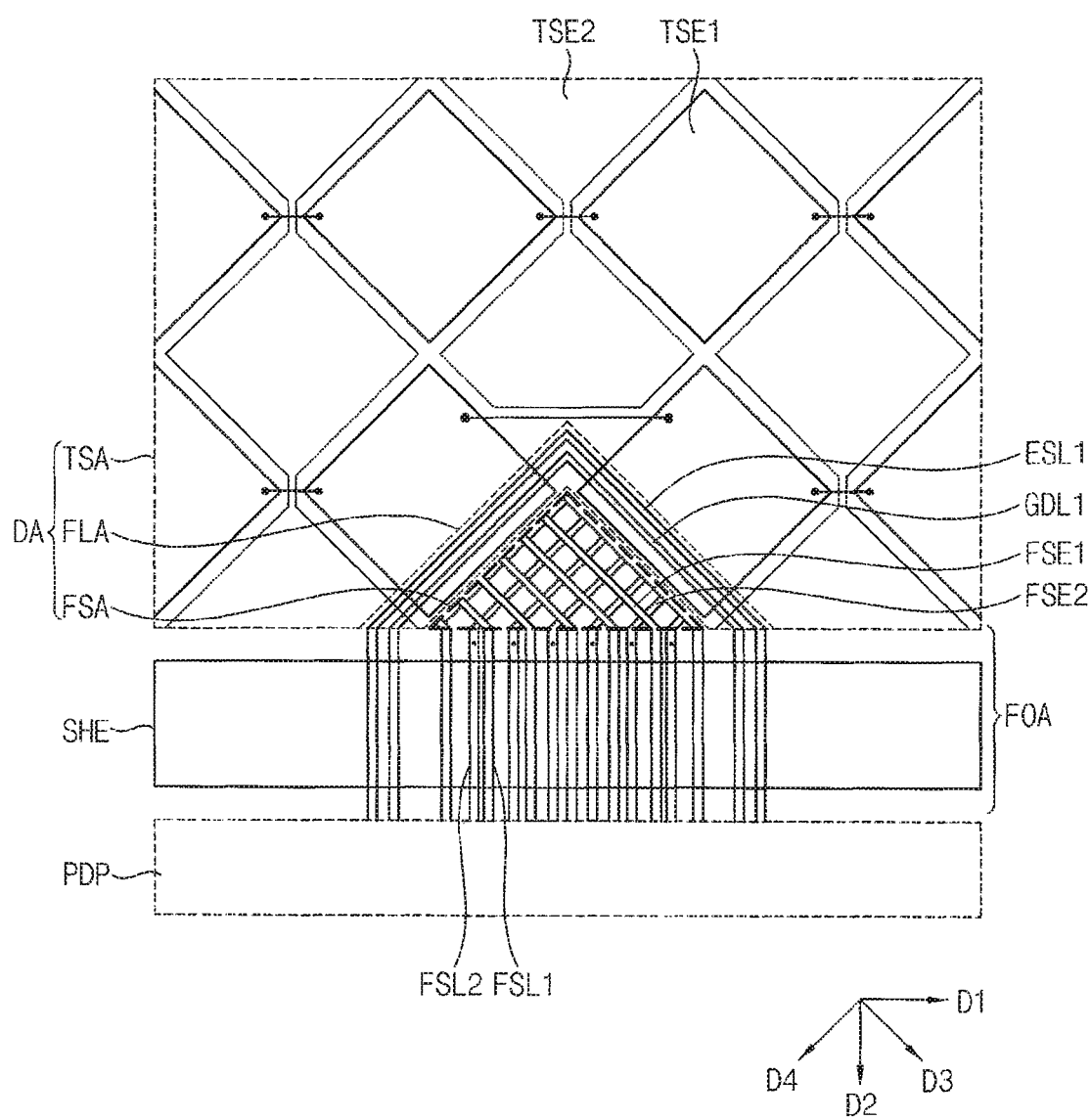
FIG. 13 is an enlarged plan view illustrating a touch display apparatus integrated fingerprint sensor according to an exemplary embodiment.

FIG. 13 is an enlarged plan view illustrating a touch display apparatus integrated fingerprint sensor according to an exemplary embodiment.

Referring to FIGS. 10 and 13, the touch display apparatus integrated fingerprint sensor may include a display area DA and a peripheral area PA surrounding the display area DA.

The display area DA may include a fingerprint sensor area FSA, a touch sensor area TSA and a fingerprint line area FLA.

The peripheral area PA may include a fan-out area FOA between a display area DA and a pad part PDP connected to a sensor driver circuit SDC.

A plurality of touch sensor electrodes TSE1 and TSE2 may be arranged in the is touch sensor area TSA.

A plurality of fingerprint sensor electrodes FSE1 and FSE2 may be arranged in the fingerprint sensor area FSA.

The first fingerprint sensor electrodes FSE1 may extend in a third direction D3 crossing the first and second directions D1 and D2, and be arranged in a fourth direction D4 crossing the third direction D3. The first fingerprint sensor electrodes FSE1 may be formed from the first conductive layer.

The second fingerprint sensor electrodes FSE2 may extend in the fourth direction D4 and be arranged in the third direction D3. The second fingerprint sensor electrodes FSE2 may be formed from second conductive layer.

According to the exemplary embodiment, the fingerprint sensor area FSA in which the first and second fingerprint sensor electrodes FSE1 and FSE2 are arranged may have a triangular shape.

The fingerprint line area FLA may surround the fingerprint sensor area FSA and be included in the touch sensor area TSA.

A plurality of fingerprint lines may be associated with driving of the plurality of fingerprint sensor electrodes FSE1 and FSE2 and arranged in the fingerprint line area FLA.

For example, as shown in FIG. 13, the plurality of fingerprint lines may include a fingerprint guard line GDL1 and a fingerprint electrostatic line ESL1. The fingerprint guard line GDL1 and the fingerprint electrostatic line ESL1 may be arranged in the fingerprint line area FLA.

The fingerprint guard line GDL1 may be formed from the first conductive layer. The fingerprint guard line GDL1 may respectively extend in the third direction D3 and fourth directions D3 and D4 in the fingerprint line area FLA and extend in the second direction D2 in the fan-out area FOA.

The fingerprint guard line GDL1 may be connected to the pad part PDP. The fingerprint guard line GDL1 may be configured to receive the ground signal GND and may prevent external signals from interfering with the first and second fingerprint sensor electrodes FSE1 and FSE2.

The fingerprint electrostatic line ESL1 may be adjacent to the fingerprint guard line GDL1. The fingerprint guard line GDL1 may be formed from the first conductive layer. The fingerprint guard line GDL1 may respectively extend in the third and fourth directions D3 and D4 in the fingerprint line area FLA and extend in the second direction D2 in the fan-out area FOA.

The fingerprint electrostatic line ESL1 may be connected to the pad part PDP. The fingerprint electrostatic line ESL1 may be configured to receive the ground signal GND and may shield the first and second fingerprint sensor electrodes FSE1 and FSE2 from electrostatic discharge.

The first fingerprint sensor line FSL1 may be connected to the first fingerprint sensor electrode FSE1. The first fingerprint sensor line FSL1 may extend in the second direction D2 and be disposed in the fan-out area FOA. The first fingerprint sensor line FSL1 may be formed from the first conductive layer.

The second fingerprint sensor line FSL2 may be connected to the second fingerprint sensor electrode FSE2. The second fingerprint sensor line FSL2 may extend in the second direction D2 and be disposed in the fan-out area FOA. The second fingerprint sensor line FSL2 may be formed from the first conductive layer and be connected to the second fingerprint sensor electrode FSE2 through a contact hole.

According to the exemplary embodiment, the plurality of fan-out lines arranged in the fan-out area FOA may correspond to partial lines of the fingerprint sensor lines FSL1 and FSL2.

The shielding electrode SHE may be disposed in the fan-out area FOA in which the fingerprint sensor lines FSL1 and FSL2 are arranged.

The shielding electrode SHE may be formed from the second conductive layer and cover over the fan-out lines FOL.

The shielding electrode SHE may be connected to at least one of the touch guard line GDL2 and the touch electrostatic line ESL2 and be configured to receive the ground signal GND. Alternatively, the shielding electrode SHE may be connected to at least one of the fingerprint guard line GDL1 and the fingerprint electrostatic line ESL1 which receive the ground signal.

Therefore, the shielding electrode SHE may shield the fan-out lines FOL of the fingerprint sensor lines from interference by the contacting finger.

According to the exemplary embodiment, in the fingerprint sensor mode, when the finger is contacting the fingerprint line area, the touch sensor electrodes shield the first fingerprint sensor lines from interference by the contacting finger and thus errors of detecting the fingerprint may be avoided.

According to the exemplary embodiments, the fingerprint sensor lines are disposed under the touch sensor electrodes and thus, in the fingerprint sensor mode, the touch sensor electrodes shield the first fingerprint sensor lines from interference by the contacting finger and thus errors of detecting the fingerprint may be avoided. In addition, the ground signal is applied to the touch sensor electrodes to increase a shield function.

The shielding electrode is disposed on the fan-out line of the fingerprint sensor line and thus, in the fingerprint sensor mode, the touch sensor electrodes shield the first fingerprint sensor lines from interference by the contacting finger and thus errors of detecting the fingerprint may be avoided. In addition, the shielding electrode is connected to the guard line or the electrostatic line which receive the ground signal to increase a shield function.

The present inventive concepts may be applied to a display device and an electronic device having the display device. For example, the present inventive concepts may be applied to a computer monitor, a laptop, a digital camera, a cellular phone, a smart phone, a smart pad, a television, a personal digital assistant (PDA), a portable multimedia player (PMP), a MP3 player, a navigation system, a game console, a video phone, etc.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

What is claimed is:

1. A touch display apparatus integrated fingerprint sensor:
a plurality of pixels arranged in a display area;
a plurality of touch sensor electrodes arranged in a touch sensor area overlapping with the display area;
a plurality of fingerprint sensor electrodes arranged in a fingerprint sensor area which is spaced apart from the touch sensor area and overlaps with the display area; and
a plurality of fingerprint lines associated with driving the plurality of fingerprint sensor electrodes, the plurality of fingerprint lines overlapping with and being spaced apart from a portion of the plurality of touch sensor electrodes which is located in an area adjacent to the fingerprint sensor area,
wherein the plurality of touch sensor electrodes comprises:
a first touch sensor electrode extending in a first direction and comprising a plurality of first connection patterns and a plurality of first touch electrode patterns, the plurality of first connection patterns formed from a first conductive layer, and the plurality of first touch electrode patterns connected to each other by the plurality of first connection patterns and formed from a second conductive layer which is different from the first conductive layer; and
a second touch sensor electrode extending in a second direction crossing the first direction and comprising a plurality of second connection patterns and a plurality of second touch electrode patterns, the plurality of second connection patterns formed from the second conductive layer, and the plurality of second touch electrode patterns connected to each other by the plurality of second connection patterns and formed from the second conductive layer.

2. The touch display apparatus of claim 1, wherein the plurality of fingerprint sensor electrodes comprise:
a first fingerprint sensor electrode extending in the first direction and formed from the first conductive layer; and
a second fingerprint sensor electrode extending in the second direction crossing the first direction and formed from the second conductive layer.

3. The touch display apparatus of claim 1, wherein the plurality of fingerprint lines are formed from the first conductive layer, and the plurality of first touch electrode patterns and the plurality of second touch electrode patterns of the touch sensor electrodes are formed from the second conductive layer.

4. The touch display apparatus of claim 3, wherein the plurality of fingerprint lines comprise a plurality of fingerprint sensor lines which are respectively connected to the plurality of fingerprint sensor electrodes.

5. The touch display apparatus of claim 4, wherein an odd numbered fingerprint sensor line is connected to an odd numbered fingerprint sensor electrode and an even numbered fingerprint sensor line is connected to an even numbered fingerprint sensor electrode,
wherein the odd numbered fingerprint sensor line is disposed at a first side portion of the fingerprint sensor area and the even numbered fingerprint sensor line is disposed at a second side portion of the fingerprint sensor area, the second side portion of the fingerprint sensor area being opposite to the first side portion of the fingerprint sensor area.

6. The touch display apparatus of claim 4, wherein the fingerprint sensor lines are disposed at a first side portion of the fingerprint sensor area or a second side portion of the fingerprint sensor area, the second side portion of the fingerprint sensor area being opposite to the first side portion of the fingerprint sensor area.

7. The touch display apparatus of claim 4, wherein the plurality of fingerprint lines comprise a fingerprint guard line surrounding the fingerprint sensor area and shielding the plurality of fingerprint sensor electrodes from external signal interference.

8. The touch display apparatus of claim 4, wherein the plurality of fingerprint lines comprise a fingerprint electrostatic line surrounding the fingerprint sensor area and shielding the plurality of fingerprint sensor electrodes from electrostatic discharge.

9. The touch display apparatus of claim 4, further comprising:
a sensor driver circuit configured to drive the touch sensor electrodes and the fingerprint sensor electrodes,
wherein the sensor driver circuit is configured to provide the fingerprint sensor lines with a ground signal during a touch sensor period and provide the touch sensor electrodes with the ground signal during a fingerprint sensor period.

10. The touch display apparatus of claim 9, further comprising:
a plurality of fan-out lines arranged in a peripheral area between the fingerprint sensor area and the sensor driver circuit and connected to the fingerprint sensor lines;
a shielding electrode disposed on the plurality of fan-out lines and receiving a ground signal;
a touch guard line surrounding the touch sensor area and preventing external signals from interfering with the touch sensor electrodes; and
a touch electrostatic line surrounding the touch sensor area and shielding the touch sensor electrodes from electrostatic discharge.

11. The touch display apparatus of claim 10, wherein the shielding electrode is connected to at least one of the touch guard line and the touch electrostatic line.

12. The touch display apparatus of claim 1, wherein the plurality of fingerprint sensor electrodes comprise:

a first fingerprint sensor electrode extending in a third direction crossing the first and second directions and formed from the first conductive layer; and a second fingerprint sensor electrode extending in a fourth direction crossing the third direction and formed from the second conductive layer.

13. The touch display apparatus of claim 12, wherein the plurality of fingerprint lines comprise a fingerprint guard line which surrounds the fingerprint sensor area and shielding the plurality of fingerprint sensor electrodes from external signals.

14. The touch display apparatus of claim 12, wherein the plurality of fingerprint lines comprise a fingerprint electrostatic line surrounding the fingerprint sensor area and shielding the plurality of fingerprint sensor electrodes from electrostatic discharge.

15. The touch display apparatus of claim 12, further comprising:

a pad part disposed in a peripheral area surrounding the display area;

a plurality of fan-out lines arranged in the peripheral area between the pad part and the display area;

a shielding electrode disposed on the fan-out lines and receiving a ground signal;

a touch guard line surrounding the touch sensor area and shielding the touch sensor electrodes from external signals; and a touch electrostatic line surrounding the touch sensor area and shielding the touch sensor electrodes from electrostatic discharge.

16. The touch display apparatus of claim 15, wherein the shielding electrode is connected to at least one of the touch guard line and the touch electrostatic line.

17. The touch display apparatus of claim 1, further comprising:

a base substrate;

a pixel circuit disposed on the base substrate and comprising a plurality of transistors;

a display element layer disposed on the pixel circuit and comprising a plurality of display elements which display a grayscale image using a light; and an encapsulation layer covering over the display element layer and disposed on the display element layer, wherein the first conductive layer is disposed on the encapsulation layer and the second conductive layer is disposed on the first conductive layer.

18. The touch display apparatus of claim 17, wherein each of the plurality of display elements comprises an organic light emitting diode.

* * * * *